United States Patent [19]
Burks et al.

[11] Patent Number: 5,946,475
[45] Date of Patent: Aug. 31, 1999

[54] METHOD FOR PERFORMING TRANSISTOR-LEVEL STATIC TIMING ANALYSIS OF A LOGIC CIRCUIT

[75] Inventors: Timothy Michael Burks; Robert Edward Mains, both of Austin, Tex.

[73] Assignee: International Business Machines Corporation, Armonk, N.Y.

[21] Appl. No.: 08/786,582

[22] Filed: Jan. 21, 1997

[51] Int. Cl.[6] .................................................. G06F 17/50
[52] U.S. Cl. ......................................................... 395/500.07
[58] Field of Search ..................................... 364/491, 490, 364/488, 578

[56] References Cited

U.S. PATENT DOCUMENTS

| | | | |
|---|---|---|---|
| 4,827,428 | 5/1989 | Dunlop et al. | 364/491 |
| 4,924,430 | 5/1990 | Zasio et al. | |
| 5,095,454 | 3/1992 | Huang | |
| 5,191,541 | 3/1993 | Landman et al. | |
| 5,222,030 | 6/1993 | Dangelo et al. | |
| 5,323,401 | 6/1994 | Maston | |
| 5,365,463 | 11/1994 | Donath et al. | |
| 5,475,605 | 12/1995 | Lin | |
| 5,475,607 | 12/1995 | Apte et al. | |
| 5,493,508 | 2/1996 | Dangelo et al. | |
| 5,508,937 | 4/1996 | Abato et al. | |
| 5,787,008 | 7/1998 | Pullela et al. | 364/489 |

OTHER PUBLICATIONS

Norman P. Jouppi, Timing Analysis for nMOS VLSI, IEEE, 0738–100X/83/0000/0411, 1983.

Bryant, Randal E., "Graph–Based Algorithms for Boolean Function Manipulation," *IEEE Transactions on Computers*, vol. C–35, vol. 8, Aug. 1986, pp. 677–691.

Dagenais, Michel R., et al., "Transistor–Level Estimation of Worst–Case Delays in MOS VLSI Circuits," *IEEE Transactions on Computer–Aided Design*, vol. 11, No. 3, Mar. 1992, pp. 384–395.

Desai, Madhav P., et al., "A systematic technique for verifying critical path delays in a 300MHz Alpha CPU design using circuit simulation," *33rd Design Automation Conference*, ACM, Inc., 1996.

Hitchcock, Sr., Robert B., et al., "Timing Analysis of Computer Hardware," *IBM J. Res. Develop.*, vol. 26, No. 1, Jan. 1982, pp. 100–105.

Jouppi, Norman P., "Timing Analysis and Performance Improvement of MOS VLSI Designs," *IEEE Transactions on Computer–Aided Design*, vol. CAD–6, No. 4, Jul. 1987, pp. 650–665.

Ousterhout, John K., "Crystal: A Timing Analyzer for nMOS VLSI Circuits," *Proc. Third Cal–Tech VLSI Conf.*, Computer Sciences Press, 1983, pp. 57–69.

Pillage, Lawrence T., "Asymptotic Waveform Evaluation for Timing Analysis," *IEEE Transactions on Computer–Aided Design*, vol. 9, No. 4, Apr. 1990, pp. 352–366.

Ratzlaff, Curtis L., et al., "RICE: Rapid Interconnect Circuit Evaluator," *28th ACM/IEEE Design Automation Conference*, Paper 33.1, 1991, pp. 555–560.

Ratzlaff, Curtis L., et al., RICE *Toolkit Reference Manual, Version 4.0*, Computer Engineering Research Center, The University of Texas at Austin, Austin, Texas, Sep., 1992.

*Primary Examiner*—Kevin J. Teska
*Assistant Examiner*—Mark J. Fink
*Attorney, Agent, or Firm*—Winstead Sechrest & Minick P.C.; Anthony V. S. England

[57] ABSTRACT

A method is provided for statically computing delays for transistor-level logic circuits which have input signal dependencies. This methodology may be implemented in transistor-level static timing analysis tools which compute delays of blocks or subcircuits that correspond to channel-connected components of transistors.

19 Claims, 9 Drawing Sheets

METHOD FOR PERFORMING TRANSISTOR-LEVEL STATIC TIMING ANALYSIS OF A LOGIC CIRCUIT

CROSS-REFERENCE TO RELATED APPLICATION

This application is related to our commonly assigned, co-pending patent applications entitled:

"METHOD FOR PERFORMING TIMING ANALYSIS OF A CLOCK-SHAPING CIRCUIT" by Burks et al. Ser. No. 08/757,977;

"METHOD FOR PERFORMING TIMING ANALYSIS OF A CLOCK CIRCUIT" by Burks, et al. Ser. No. 08/757,976; and "METHOD FOR TRANSISTOR-LEVEL CALCULATION OF THE PRECHARGE TIME OF DOMINO LOGIC CIRCUITS WITH UNCLOCKED EVALUATION PATHS" by Burks, et al. Ser. No. 08/736,055.

TECHNICAL FIELD

This invention relates generally to a static timing analysis tool, and more particularly, to a static timing analysis tool for transistor-level descriptions of logic circuits.

BACKGROUND INFORMATION

A wide variety of design verification tools are required to produce a working integrated circuit from a functional specification. These tools analyze different parameters of a circuit design to insure that the circuit will function properly after it is fabricated. One important set of verification tools includes timing analysis tools which are widely used to predict the performance of very large scale integrated (VLSI) designs. Such timing analysis tools may be either static or dynamic. Dynamic timing analysis tools provide the most detailed and accurate information obtainable concerning the performance of a circuit. This type of timing analysis is often generated through simulation of a circuit model by simulation programs which operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These dynamic timing analysis programs typically operate by solving matrix equations relating to the circuit parameters such as voltages, currents, and resistances. Additionally, such circuit simulation approaches to performance analysis are pattern dependent, or stated another way, the possible paths and the delays associated therewith depend upon a state of a controlling mechanism or machine of the circuit being simulated. Thus, the result of a dynamic timing analysis depends on the particular test pattern, or vector, applied to the circuit.

While such circuit simulation programs and dynamic timing analysis tools provide high accuracy, long simulation times are required because a large number of patterns must be simulated because the best and worst case patterns are not known before the simulation occurs. In fact, a number of simulations which must be performed is proportional to $2^n$, where "n" is a number of inputs to the circuit being simulated. Thus, for circuits having a large number of inputs, dynamic timing analysis is not always practical.

Static timing analysis tools are also widely used to predict the performance of VLSI designs. Static timing analyzers are often used on very large designs for which exhaustive timing accurate simulation (also called dynamic timing analysis) is impossible or impracticable. In static timing analysis, it is assumed that each signal switches independently in each machine cycle. Furthermore, in static timing analysis, only the best and worst possible rising and falling times are computed for each signal in the circuit; such times are typically determined in a single pass through a topologically-sorted circuit. When referring to a topologically sorted circuit, it should be noted that a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., *IBM J. Res. Develop.*, Vol. 26, No. 1, pp. 100–105 (1982).

Transistor-level timing analyzers eliminate the need for predefined cell libraries by decomposing circuits into channel-connected components and automatically computing the delay of each component. Such channel connected components are non-intersecting groups of transistors which are connected by source and drain terminals to one another and to supply and ground nets, or connections. Each channel connect component can be analyzed independently to compute the worst case delays from each input to each output for both rising and falling signals.

To compute a delay in a channel-connected component, it is necessary to determine which transistors are conducting and non-conducting during a particular delay analysis. This is commonly done by tracing paths in the channel-connected component from output nets to supply and ground nets to find all possible pull-up and pull-down paths. Delays for each path are computed independently by enabling all transistors in the path and disabling all other transistors in the channel-connected component to ensure that all other paths are inactive.

This approach works well for most CMOS circuits but assumes that the input signals to a channel-connected component are logically independent. Dependencies among input signals can cause the approach to fail in at least four significant ways:

1. Input signal dependencies can force other paths to be enabled along with the path of interest, so that the delay of the path overestimates the actual delay.
2. Input signal dependencies can force signals to switch simultaneously.
3. Input signal dependencies can make a path through a channel-connected component unsensitizable, such that any delay associated with the path is logically impossible.
4. Input signal dependencies can allow side transistors to be turned on, adding to the capacitive load seen during the switching event.

Figure 1:
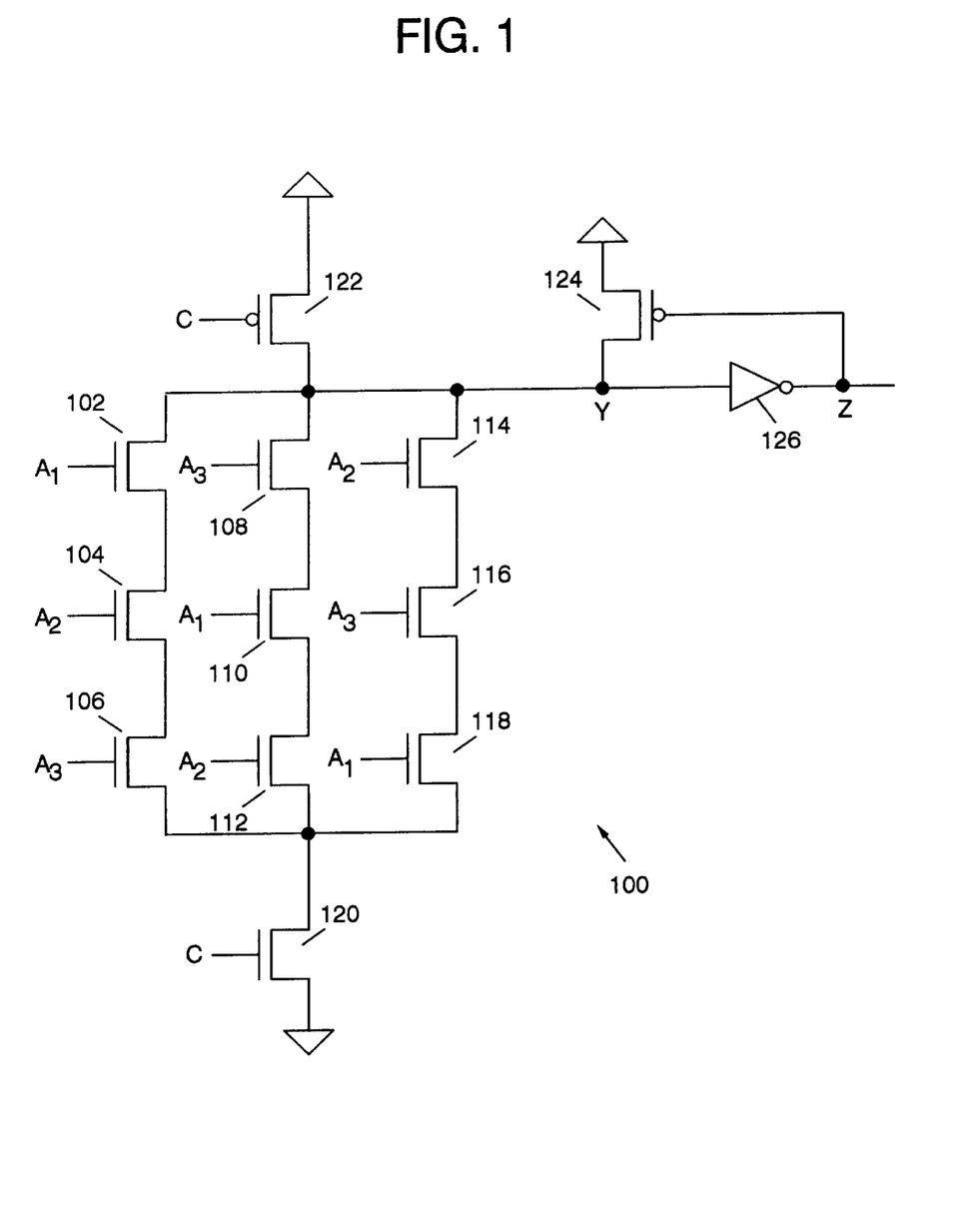
FIG. 1 illustrates, in circuit diagram form, a first logic circuit.

The first type of failure is illustrated in FIG. 1, which shows a domino AND gate 100 designed to have a balanced input-to-output delay on each input-to-output path. Approaches based on path tracing will compute the delay of each pull-down path separately and overestimate the delay of the gate because in reality, when any one pull-down path is enabled, all three are enabled and are working together to pull down node Y.

Figure 2:
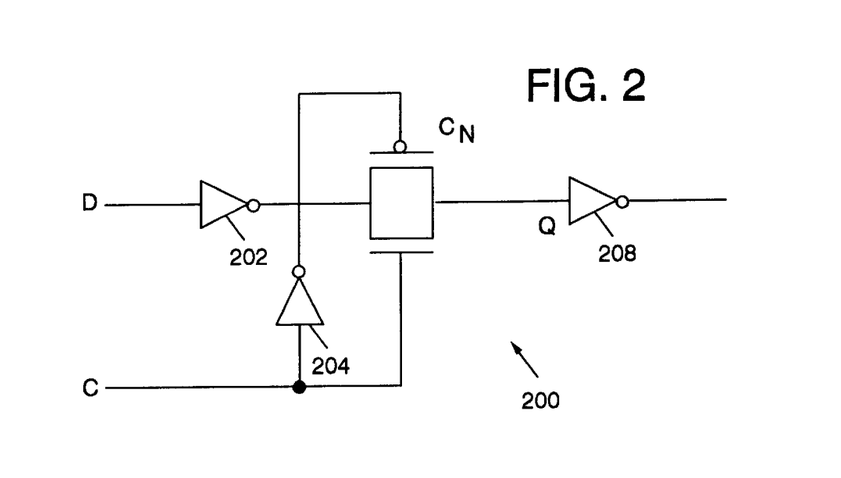
FIG. 2 illustrates, in circuit diagram form, a second logic circuit.

The second type of failure is illustrated in FIG. 2, which shows a complementary pass-transistor circuit 200 Signal $C_N$ is the inverse of signal C and will switch in response to a transition on C. A measurement of delay from C to Q should include the effects of a transition on $C_N$.

Figure 3:
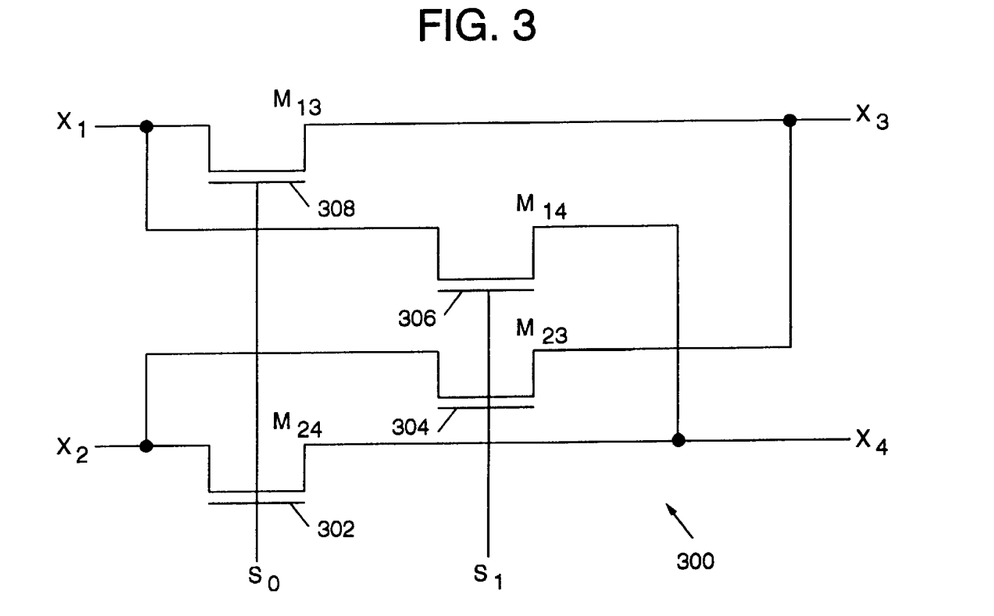
FIG. 3 illustrates, in circuit diagram form, a third logic circuit.

The third type of failure is illustrated in FIG. 3, which illustrates a two-bit crossbar circuit. Depending on the values of select lines $S_0$ and $S_1$, nets $X_1$ and $X_2$ can be connected to nets $X_3$ and $X_4$ respectively, or nets $X_4$ and $X_3$ respectively. For the circuit to operate correctly, select lines $S_0$ and $S_1$ can never be high at the same time. Techniques that ignore the relationship between $S_0$ and $S_1$ will trace false paths in this circuit and produce overly pessimistic results. For example, starting at net $X_4$, a path can be traced back through transistors $M_{24}$ (302), $M_{23}$ (304), and $M_{13}$ (306) to net $X_1$. Including this path in the delay calculation will produce an overly pessimistic delay from $X_1$ to $X_4$, since the path can never be enabled, or sensitized, and all sensitizable paths go through a single transistor in the crossbar. Previous approaches have attempted to eliminate these paths by associating directions with individual transistors. However, depending on the circuits attached to nets $X_1$, $X_2$, $X_3$, and $X_4$, the pass transistors may be truly bidirectional, and the only way to eliminate the paths automatically is to account for the logical dependencies among inputs $S_0$ and $S_1$.

Figure 4:
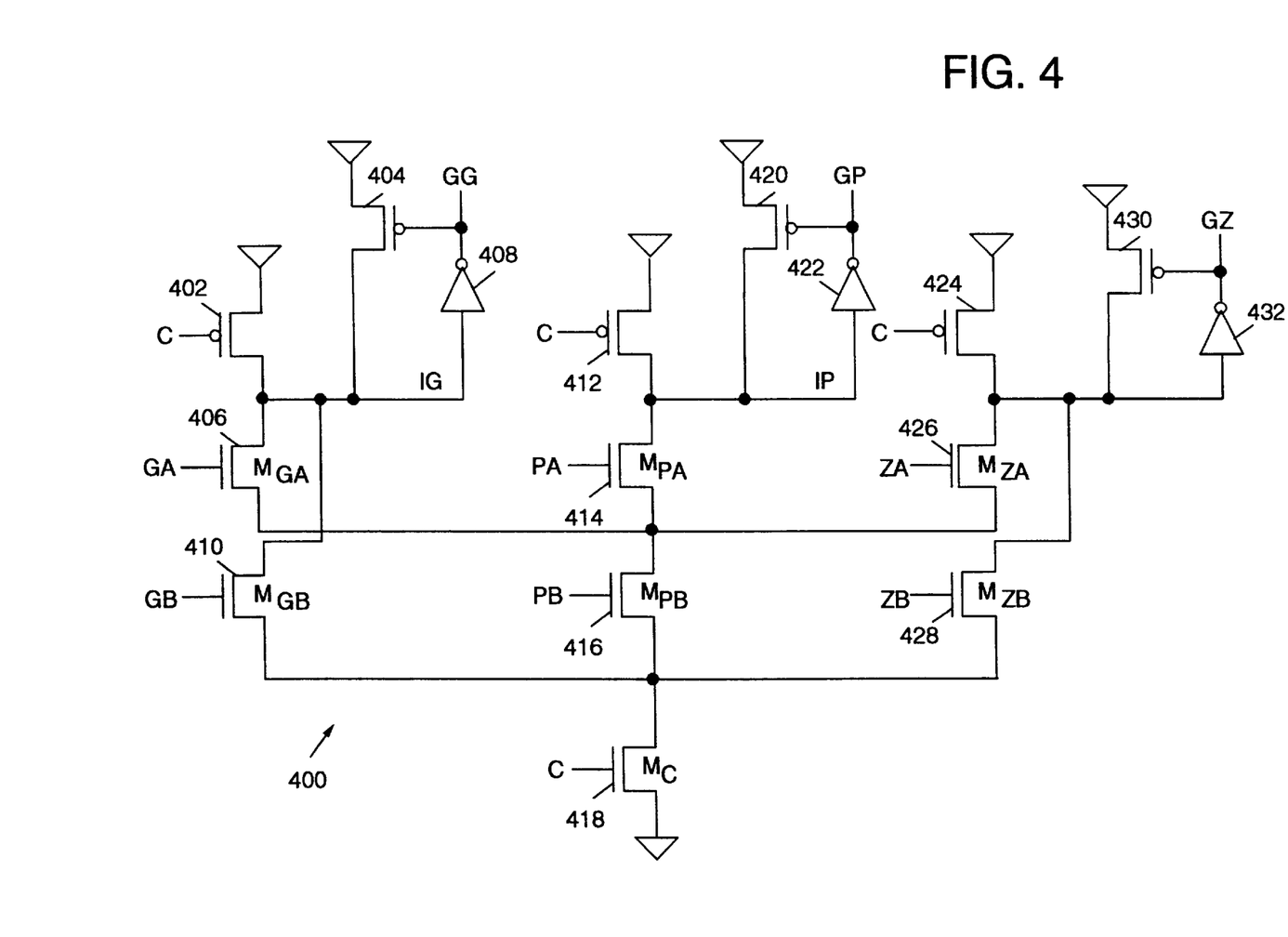
FIG. 4 illustrates, in circuit diagram form, a fourth logic circuit.

The fourth type of failure is illustrated in FIG. 4 which shows a subcircuit of a dynamic carry lookahead adder circuit 400. The subcircuit is used to combine "generate (G)", "zero" (Z), and "propagate" (P) bits of intermediate stages into "group generate" (GG), "group zero" (GZ), and "group propagate" (GP) bits. The structure of the adder ensures that for each trio of "generate", "zero", and "propagate" bits, at most one signal is high. Delay calculation techniques that don't account for this fact can overestimate switching delays. For example, when computing the delay from input ZB to node IZ, transistors $M_{ZB}$ and $M_c$ must be enabled to cause the voltage at node IZ to fall when the voltage on input ZB rises. Values for the remaining inputs are not directly specified and are often set to disable all other transistors in the subcircuit. However, this can cause the delay to be underestimated because when ZA has a high voltage, a transistor $M_{ZA}$ is enabled and an additional capacitance must be discharged before IZ can completely fall. Many path-based timing analyzers allow a limited number of transistors adjacent to the path to be enabled to account for this extra capacitance.

Typically, a user will specify the number of transistors to enable on any side path to a path being analyzed. However, this limit is arbitrary and if set too high, can cause the true path to be short-circuited. For example, in FIG. 4, if the limit is set to 2, transistors $M_{ZA}$ and $M_{PB}$ would be enabled, short-circuiting the path through $M_{ZB}$ and making it impossible to measure the delay from input ZB. A more sophisticated delay calculation technique would set side inputs to values that satisfied dependencies among input signals while continuing to sensitize the path of interest. For the circuit in FIG. 4, setting input ZB high forces inputs GB and PB low and if input ZA is set high to maximize the capacitance seen at output IZ, then inputs GA and PA must also be low. This combination of input values accurately reflects the operating environment of the circuit and provides a worst-case sensitization of the path being analyzed.

As these examples illustrate, although the traditional transistor level static timing analysis approach is adequate for many logic circuits, it does not provide for proper timing analysis of logic circuits with parallel conduction paths or with logical constraints on input signals. Therefore, a need exists for a timing analysis approach which provides for proper timing analyses for logic circuits whose performance may be affected by such parallel paths and logical constraints.

SUMMARY OF THE INVENTION

The previously mentioned needs are fulfilled with the present invention. Accordingly, there is provided, in a first form, a method for performing timing analysis of a logic circuit. The method includes the steps of identifying an input signal transition and an output signal transition of the logic circuit, computing a sensitization condition corresponding to the input signal transition and the output signal transition using the sensitization condition to identify a worst case condition, and generating a simulation pattern which enables an output of the logic circuit to transition from a first logic state to a second logic state by applying a generated signal which corresponds to the sensitization condition.

Additionally, there is provided, in a second form, a data processing system including a memory for storing a model of a logic circuit. The data processing system also includes a data processor for computing a first signal being provided to the logic circuit and a second signal being output by the logic circuit in response to the first signal. The data processor computes the delay by determining a sensitization condition corresponding to the first signal and applying a generating signal which has a sensitization condition corresponding to the first signal provided to the logic circuit.

Furthermore, there is provided, in a third form, a program storage device readable by a machine which tangibly embodies a program of instructions executable by the machine to perform method steps for performing a timing analysis of the logic circuit. The method includes the steps of identifying an input signal transition and an output signal transition of the logic circuit, computing a sensitization condition corresponding to the input signal transition and the output signal transition, using the sensitization condition to identify a worst case condition, and generating a simulation pattern which enables an output of the logic circuit to transition from a first logic state to a second logic state by applying a generated signal which corresponds to the sensitization condition.

These and other features, and advantages, will be more clearly understood from the following detailed description taken in conjunction with the accompanying drawings. It is important to note the drawings are not intended to represent the only form of the invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 7-A illustrates, in flow diagram form, one embodiment for implementing a step of computing and propagating delays in accordance with the methodology of the present invention as illustrated in FIG. 6;

FIG. 7-B illustrates, in flow diagram form, a remaining portion of the step of computing and propagating delays in accordance with the methodology of the present invention as illustrated in FIG. 7-A;

DETAILED DESCRIPTION

This invention provides a method for statically computing delays for transistor-level logic circuits which have input signal dependencies. The methodology of the present invention may be implemented in transistor-level static timing analysis tools which compute delays of blocks or subcircuits that correspond to channel-connected components of transistors. The static timing analysis techniques traditionally implemented to evaluate data processing systems are modified to more accurately compute signal times at the outputs of such logic circuits. The operation and implementation of the present invention will subsequently be described in greater detail.

During a following description of the implementation of the invention, the terms "assert" and "negate" and various grammatical forms thereof, are used to avoid confusion when dealing with a mixture of "active high" and "active low" logic signals. "Assert" is used to refer to the rendering of a logic signal or register bit into its active, or logically true state. "Negate" is used to refer to the rendering of a logic signal or register bit into its inactive or logically false state.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 5:
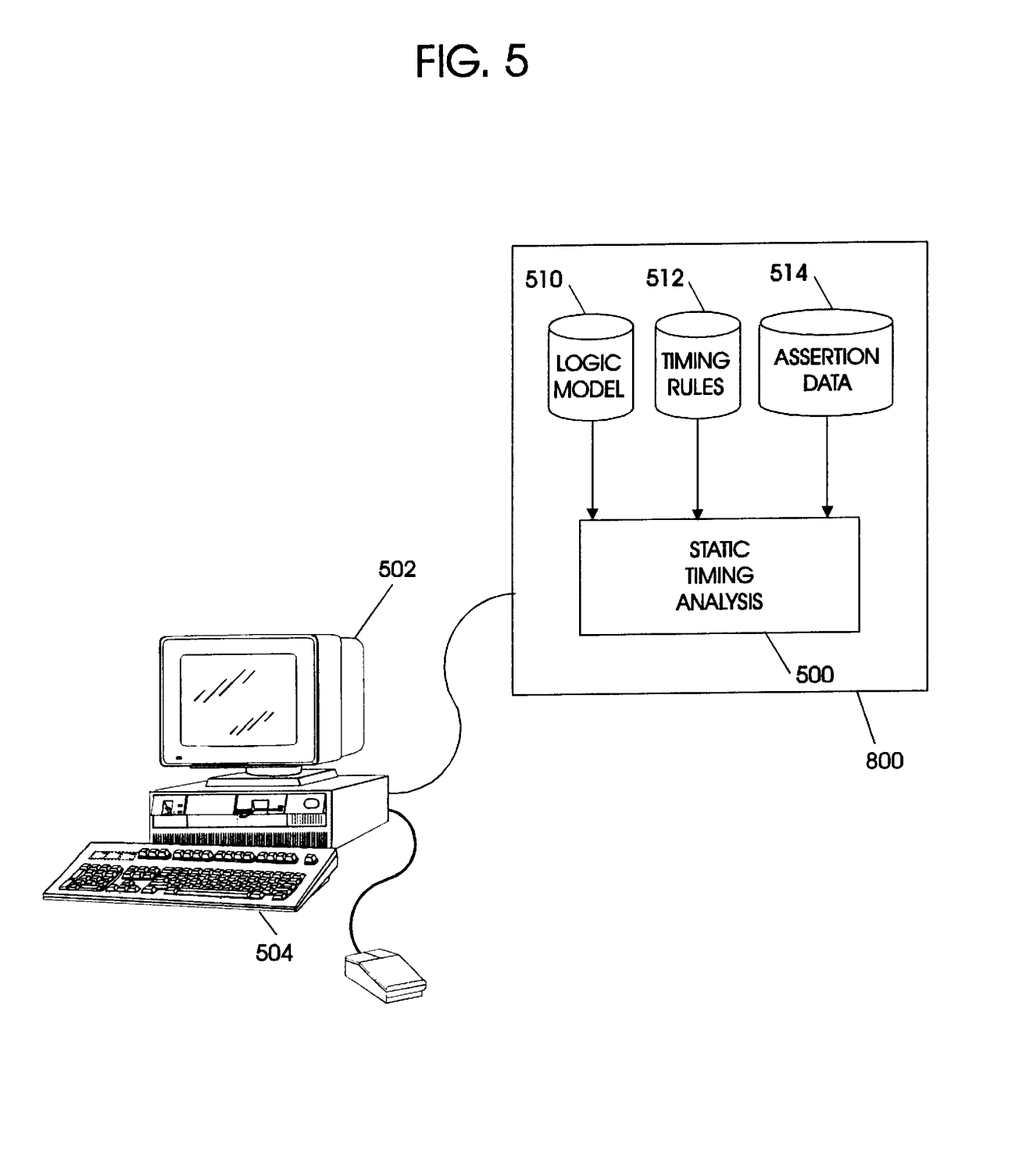
FIG. 5 illustrates, in block diagram form, a data processing system which implements one embodiment of the present invention.

FIG. 5 is a block diagram illustrating a data processing system in which the present invention may be used. The data processing system of FIG. 5 comprises a terminal 502, an input device 504, and a data processing system 800. When utilizing the present invention, a circuit design engineer may access the static timing analysis program stored in data processing system 800 using both terminal 502 and input device 504. Use of terminal 504 and input device 504 to access a static timing analysis is well-known to those skilled in the data processing art and will not be described in greater detail herein.

Figure 8:
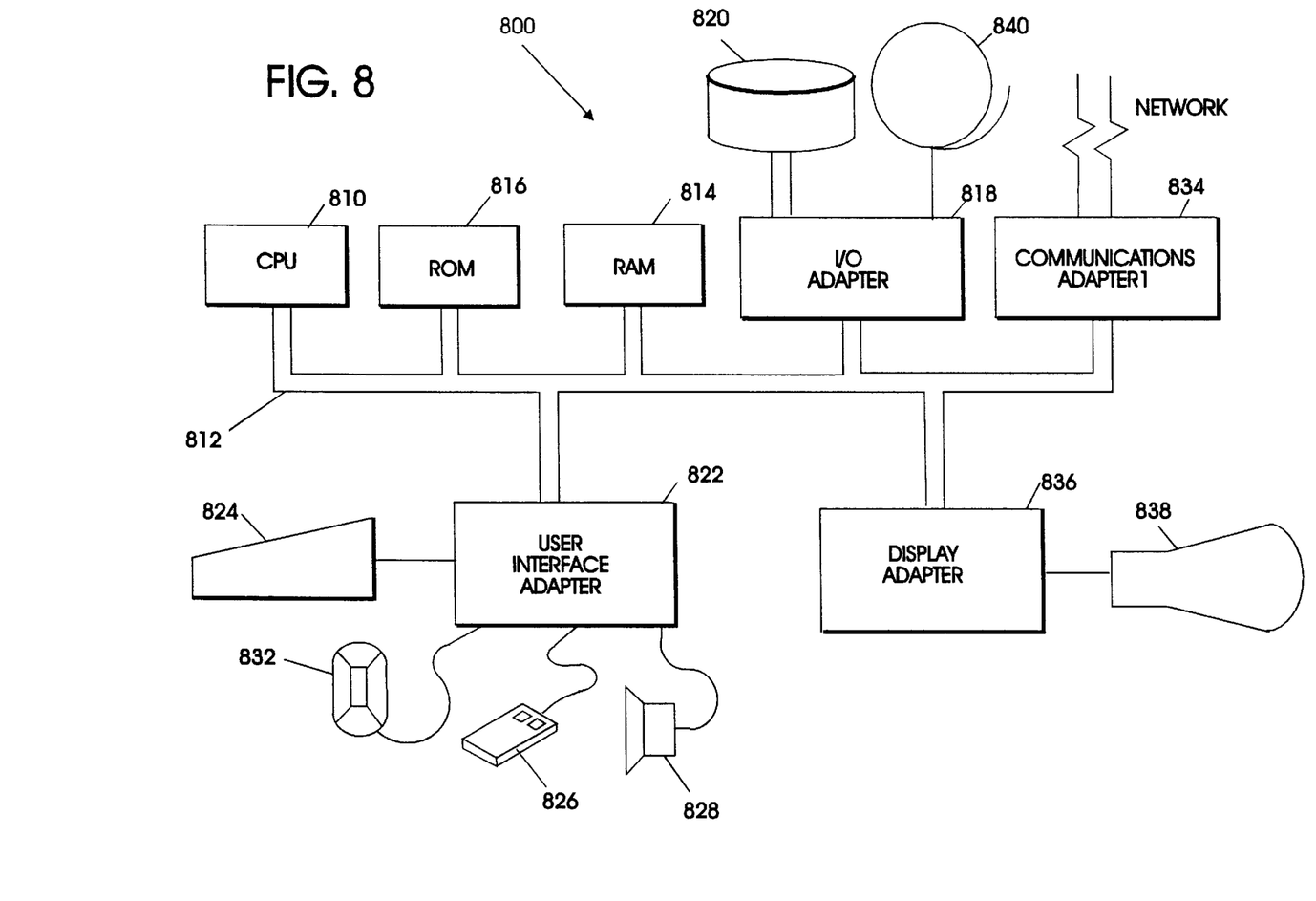
FIG. 8 illustrates, in block diagram form, a data processing system in accordance with an embodiment of the present invention.

FIG. 8 is a block diagram illustrating an alternate embodiment of a data processing system, such as data processing system 800, which may be used to implement the present invention.

Referring first to FIG. 8, an example is shown of a data processing system 800 which may be used for the invention. The system has a central processing unit (CPU) 810, such as a PowerPC microprocessor ("PowerPC" is a trademark of IBM Corporation) according to *The PowerPC Architecture: A Specification for a New Family of RISC Processors*, 2d edition, 1994, Cathy May, et al, Ed., which is hereby incorporated herein by reference. A more specific implementation of a PowerPC microprocessor is described in the "PowerPC 604 RISC Microprocessor Users Manual", 1994, IBM Corporation, which is hereby incorporated herein by reference. The history buffer (not shown) of the present invention is included in CPU 810. The CPU 810 is coupled to various other components by system bus 812. Read only memory ("ROM") 816 is coupled to the system bus 812 and includes a basic input/output system ("BIOS") that controls certain basic functions of the data processing system 800. Random access memory ("RAM") 814, I/O adapter 818, and communications adapter 834 are also coupled to the system bus 812. I/O adapter 818 may be a small computer system interface ("SCSI") adapter that communicates with a disk storage device 820. Communications adapter 834 interconnects bus 812 with an outside network enabling the data processing system to communication with other such systems. Input/Output devices are also connected to system bus 812 via user interface adapter 822 and display adapter 836. Keyboard 824, track ball 832, mouse 826 and speaker 828 are all interconnected to bus 812 via user interface adapter 822. Display monitor 838 is connected to system bus 812 by display adapter 836. In this manner, a user is capable of inputting to the system throughout the keyboard 824, trackball 832 or mouse 826 and receiving output from the system via speaker 828 and display 838. Additionally, an operating system such as AIX ("AIX" is a trademark of the IBM Corporation) is used to coordinate the functions of the various components shown in FIG. 8.

Preferred implementations of the invention include implementations as a computer system programmed to execute the method or methods described herein, and as a computer program product. According to the computer system implementation, sets of instructions for executing the method or methods are resident in the random access memory 814 of one or more computer systems configured generally as described above. Until required by the computer system, the set of instructions may be stored as a computer program product in another computer memory, for example, in disk drive 820 (which may include a removable memory such as an optical disk or floppy disk for eventual use in the disk drive 820). Further, the computer program product can also be stored at another computer and transmitted when desired to the user's work station by a network or by an external network such as the Internet. One skilled in the art would appreciate that the physical storage of the sets of instructions physically changes the medium upon which it is stored so that the medium carries computer readable information. The change may be electrical, magnetic, chemical or some other physical change. While it is convenient to describe the invention in terms of instructions, symbols, characters, or the like, the reader should remember that all of these and similar terms should be associated with the appropriate physical elements.

Note that the invention describes terms such as comparing, validating, selecting or other terms that could be associated with a human operator. However, for at least a number of the operations described herein which form part of the present invention, no action by a human operator is desirable. The operations described are, in large part, machine operations processing electrical signals to generate other electrical signals.

Figure 6:
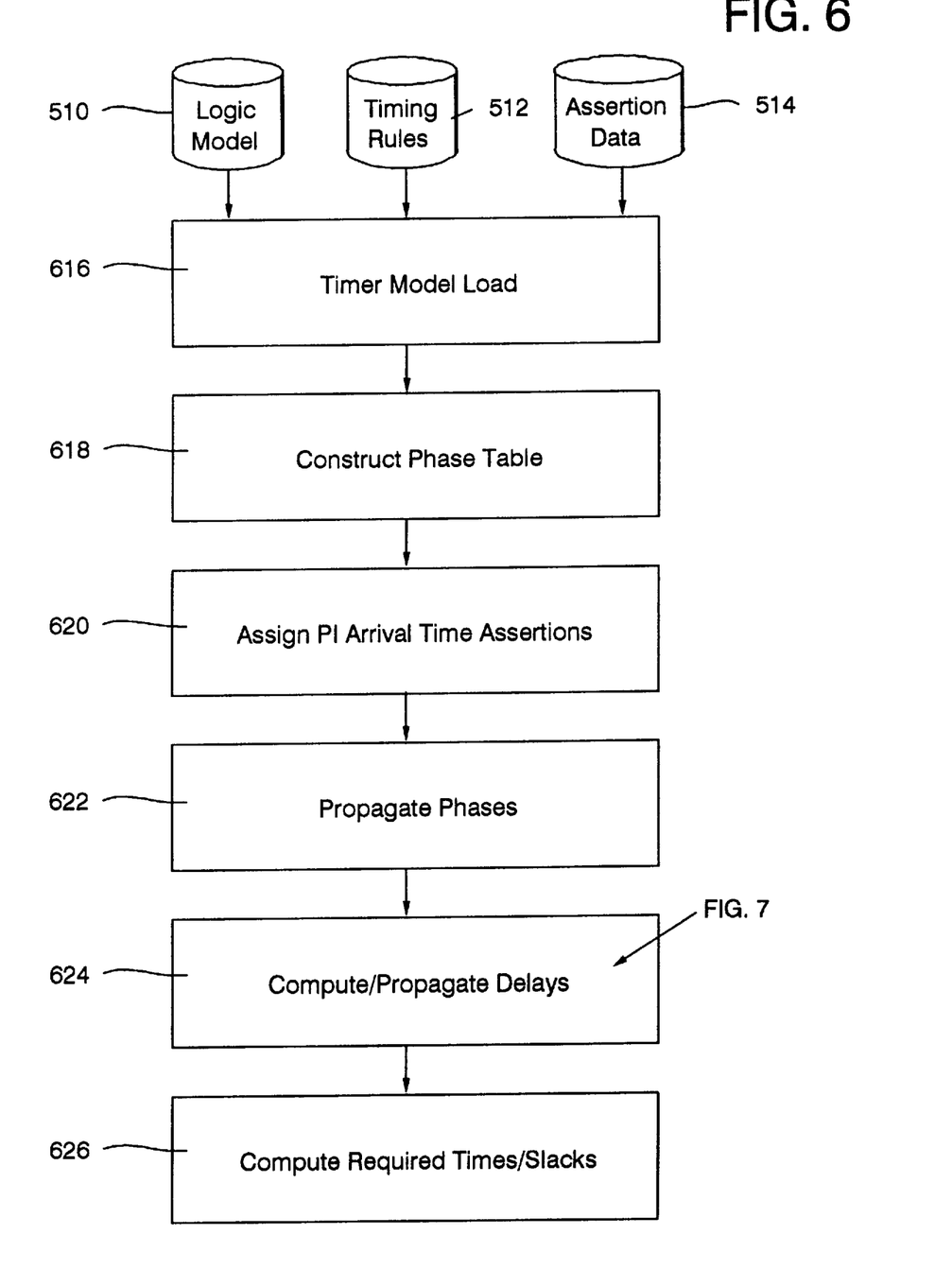
FIG. 6 illustrates, in flow diagram form, a method for performing a static timing analysis of a logic circuit in accordance with one embodiment of the present invention.

FIG. 6 is a block diagram illustrating the steps executed by data processing system 800 implement the performance of the improved static timing analysis method according to the present invention. Initially, a logic model 510, timing rules 512, and assertion data 514, which comprise primary input (PI) arrival times and clock phase definitions for all clocks are combined to establish a timer model load in block 616. The timer model load 616 constructs a graph like representation of a circuit being tested using inputs from logic model 510, timing rule 512, and assertion data 514. With phase information from assertion data 514, data processing system 500 constructs a phase table in block 618. Timing rules 512 specify individual cell delays [and timing constraints] and are optional in a transistor-based analysis system.

The phase table includes the set of tags used to label the phases of signal transitions. The phase table is used to relate those tags to a type of a signal (clock, static data, etc.) and an idealized "base time" for the signal switching event. The base time of an event can be interpreted as the time that the event would occur if all delays in the circuit being evaluated were zero. Base times are specified in a global frame of reference. Since the clock circuit is assumed to be controlled by periodic signals, a period for each phase is also stored in the phase table with its associated phase tag.

Once the phase table has been constructed in block 618, data processing system 500 (or data processing system 800) assigns the primary input arrival times (AT) assertions in block 620. Each arrival time assertion specifies both an actual signal event time and the phase associated with that event. Subsequently, data processing system 500 propagates the phases through a model of the circuit to label each point in the circuit as carrying either clock or data signals. This propagation is guided by a simple set of rules, such as those listed below:

if a subcircuit has only data inputs, then its output is a data signal if a subcircuit has clock inputs and is a latch, then its output is a data signal if a subcircuit has clock inputs and is a dynamic logic gate, then its output is a data signal if a subcircuit has clock inputs and is a static gate, then its output is a clock signal Additional rules may exist, and if necessary, users can provide manual overrides to the normal labelling.

It should be noted that this set of rules is one embodiment which may be implemented and other embodiments may also be used in the present embodiment of the invention.

Afterwards, in block 624, data processing system 600 computes delays and arrival times for all points in the circuit starting from the times given in the user-specified arrival time assertions. This results in all points in the timing model having valid signal times and associated phase tags. This step will subsequently be described in greater detail.

In block 626, data processing system 800 computes required times and slacks. It should be noted that slacks are the differences between a signal events required time and its actual arrival time. In establishing the selection of a test edge for each data test point, data processing system 800 extracts the necessary data records for the test from timing rules 512.

For the test point, data processing system 800 extracts from the timing rule the reference clock pin and reference clock level. Furthermore, data processing system 800 then obtains from the timing rule the data signal levels to be tested against the reference signal level of the clock. For the reference point in reference signal level, the system extracts from the timing delay record a phase record index. From the phase table, data processing system 800 extracts the phase time for the reference edge. For the data signal and test level, data processing system 800 extracts the phase record and index from the timing record. Next, from the phase table, data processing system 800 extracts the phase time for the data edge. Finally, data processing system determines an amount of time to adjust the required time based on a clock cycle adjustment.

To implement step 624 of the flow chart of FIG. 6, the present invention must determine whether the node being analyzed is a clock node or a data node. To determine whether or not a node is a clock node or a data node, heuristic and user-provided rules are selectively used in a preprocessing step. The distinction between data and clock nodes is important because of the assumptions made about each type of node. Signals on data nodes may or may not switch in a given cycle. Conversely, signals on a clock node are expected to switch in every cycle. In the present invention, a method is implemented for analyzing logic circuits which has data inputs and, therefore, do not have transitions which are periodic or predictable.

As previously mentioned, the present invention provides a method for static delay calculation for transistor-level descriptions of logic circuits which may have dependencies among their input signals. Key aspects of the invention are described after the following definitions:

An input net is a net attached to the gate of a transistor in the subcircuit being analyzed, typically a channel-connected component.

An output net is a net attached to a source or drain of a transistor in the subcircuit being analyzed (again, typically a channel-connected component) and to the gate of a transistor not in the subcircuit or a primary circuit output.

In the present embodiment of the invention, a Boolean variable is associated with each input net, as defined above. For example, in FIG. 1, Boolean variables are created for nodes $A_1$, $A_2$, $A_3$, C, and Y. Note that output inverter 126 is treated as a separate subcircuit.

After the boolean variables are associated with input units, pull-up and pull-down conditions for an output net are generated. For each output net, two boolean functions $l_x$ and $h_x$ are generated where X is the name of the output node. These functions indicate the conditions for the output node to be pulled low and high, respectively. These methods are generated by a variety of methods. One such method uses a depth-first traversal of the channel-connected component that begins at the output node and traces all paths to the supply and ground nodes. Each path to one ground node produces a product term to be added to $l_x$. Similarly, each path to a supply node produces a product term to be added to $h_x$. For the circuit illustrated in FIG. 1, $l_Y=(A_1A_2A_3+A_3A_1A_2+A_2A_3A_1)$ $C=A_1A_2A_3C$, and $h_Y=\overline{C}+\overline{Z}, \cdot l_Z=Y$, and $h_Z=\overline{Y}$. The boolean functions $l_x$ and $h_x$ can be conveniently represented by binary decision diagrams (BDDs).

A sensitization condition for a switching event is then defined. The present invention uses the $l_x$ and $h_x$ functions to compute the input signal values that may be set to sensitize the delay from a particular input to an output. Each input variable is considered separately and the $l_x$ and $h_x$ functions are used to determine the appropriate values of the other input signals. To sensitize a particular output transition from a particular input transition, a three-part sensitization condition must be satisfied:

1. After the input transition has finished, the output must be pulled to the desired final state.
2. After the input transition has finished, the output must not be pulled to the opposite of the desired final state.
3. Before the input transition has occurred, the output must not be pulled to the desired final state.

For example, for each net X connected to an NMOS transistor (such as net A in FIG. 1), the following sensitization condition must be true for a rising input on net X to cause a falling transition on the output net Y:

$$l_Y(X=1) \cdot \overline{h_Y(X=1)} \cdot \overline{l_Y(X=0)}$$

In other words, when X is high, the output should be pulled low and should not be pulled high and when X is low, the output should not already be pulled low. If these conditions are satisfied, a 0→1 transition on X will cause the output Y to transition to a low level. Similar conditions can be written for rising output transitions and when X is connected to a PMOS transistor. Additionally, in static CMOS circuits, a net is typically connected to both P and N transistors and can cause both rising and falling transitions on the channel-connected component output.

To determine appropriate values for the component inputs (and thus to determine whether each transistor is conducting or non-conducting), we need only to find a signal assignment which satisfies the sensitization condition defined above. For the example of FIG. 2, a signal assignment which satisfies the following equation should be derived:

$$l_Y(X=1) \cdot \overline{h_Y(X=1)} \cdot \overline{l_Y(X=0)} = 1$$

This is an instance of a problem known as Boolean satisfiability, which has been proven to be NP-hard. However, if the sensitization condition can be represented with a binary decision diagram (BDD), then a satisfying assignment can be obtained trivially as long as the BDD representing the sensitization condition does not grow too large. Since channel-connected components typically contain at most a few dozen transistors, problems with BDD size should not arise. For more information on Boolean satisfiability and BDD's, refer to "Graph-Based Algorithms for Boolean Function Manipulation", by R. Bryant, published in *IEEE Transactions on Computers*, August, 1986.

To illustrate the invention, consider two possible delay calculations for the AND gate of FIG. 1. To sensitize the rising-to-falling delay from input $A_1$ to output Y, the following sensitization condition should be constructed:

$$l_Y(A_1=1) \cdot \overline{h_Y(A_1=1)} \cdot \overline{l_Y(A_1=0)}$$

Substituting for $l_Y$ and $h_Y$:

$$1A_2A_3C \cdot \overline{(\overline{C} + \overline{Z})} \cdot \overline{0A_2A_3C}$$

Simplifying gives $A_2A_3C \cdot CZ \cdot 1$ and thus, $A_2A_3CZ$. As a result, to sensitize the rising-to-falling delay from input $A_1$ to output Y, inputs $A_2$, $A_3$, C, and Z must all be set to a logic high value.

To sensitize the falling-to-rising delay from input C to output Y, the following sensitization condition is constructed:

$$h_Y(C=0) \cdot \overline{l_Y(C=0)} \cdot \overline{h_Y(C=1)}$$

Substituting for $l_Y$ and $h_Y$, results in:

$$\overline{(0+Z)} \cdot \overline{A_1A_2A_{30}} \cdot \overline{(1+Z)}$$

Simplifying gives: $1 \cdot 1 \cdot Z$ and thus Z. As a result, to sensitize the falling-to-rising delay from input C to output Y, input Z must be set high and inputs $A_1$, $A_2$, and $A_3$ can be set arbitrarily. A heuristic worst-case assignment might be set to all three high to maximize the capacitance seen at the output node Y.

The discussion provided above described the generation of a sensitization condition for a response to a transition on a single input net. However, input signals can be constrained such that a transition on one input net implies a simultaneous transition on another input net. An example is the complementary pass transistor circuit 200 shown in FIG. 2. Signals C and $C_N$ must satisfy the following relation: $C_N = \overline{C}$, or equivalently, $\overline{C}C_N + C\overline{C_{N=1}}$. Since these are both inputs to the pass transistor stage in FIG. 2, any measurement of an output response to an input transition on net C must also include a corresponding transition on net $C_N$. Thus, to properly sensitize a delay measurement, transitions on both nets must be accounted for when generating the sensitization condition. For example, to sensitize a falling transition on output Q in response to a rising transition on input C, the following sensitization condition should be used:

$$l_Y(C=1,C_N=0) \cdot \overline{h_Y(C=1,C_{N=0})} \cdot \overline{l_Y(C=0,C_{N=1})}.$$

Substituting for $l_Y$ and simplifying gives a sensitization condition of D=1.

Input signal dependencies such as the one above can be recognized by a variety of methods, including ad hoc recognition of specific circuit structures, such as the inverter 204 between C and $C_N$ in FIG. 2, or by explicit annotation of this information by designers. However, it is also possible to identify these dependencies automatically using functional models of the logic preceding a stage being analyzed. To automatically identify any such dependencies, the following method may be used:

Being with a boolean model representing the input constraints. This can be a complete model of the circuit, a partial model provided by user annotation, or a partial model provided by expanding a number of previous stages. For each variable in the model, substitute two values, $V^-$ and $V^+$, representing its values before and after the transition, respectively. For the desired input transition, assert the signal values before and after the transition. For a rising transition, this would be $\overline{V^-}V^+$. For a falling transition, this would be $V^-\overline{V^+}$. For each remaining input, attempt to set it to a constant value by adding $(V^-V^+ + \overline{V^-V^+})$ into the circuit model. If the resulting expression becomes unsatisfiable (identically zero), then this input will be constrained to switch. If it remains satisfiable, continue attempting to force other inputs to constant values.

For the pass transistor circuit in FIG. 2, the constraint to be satisfied is $\overline{C}C_N + C\overline{C_N}$. Expanding it to use "before" and "after" variables gives $(\overline{C^-}C_N^- + C^-\overline{C_N^-})(\overline{C^+}C_N^+ + C^+\overline{C_N^+})$. A rising transition on input C corresponds to $\overline{C^-}C^+$, which when combined with the constraint gives:

$$(\overline{C^-}C_N^- + C^-\overline{C_N^-})(\overline{C^+}C_N^+ + C^+\overline{C_N^+})(\overline{C^-} + ee\ C^+) = +e, ovs\ \overline{C^-}C^+C_N^-\overline{C_N^-},$$

which by inspection indicates that input $C_N$ must fall when input C rises. Attempting to hold $C_N$ to a constant value is impossible, as can be shown by adding $(C_N^-C_N^+ + C_N^-C_N^+)$ into the constraints, giving $C^-C^+C_N^-C_N^+(C_N^-C_N^+ + C_N^-C_N^+) = 0$.

The sensitization condition presented previously could be expressed in terms of variables V⁻ and V⁺ and combined with the results of the above discussion to get a condition that includes the input constraints, selected input transition and constant nodes, and the selected output transition. However, a simpler solution (and the one used in our implementation) simply substitutes values for all switching variables directly into the sensitization condition.

Figure 9:
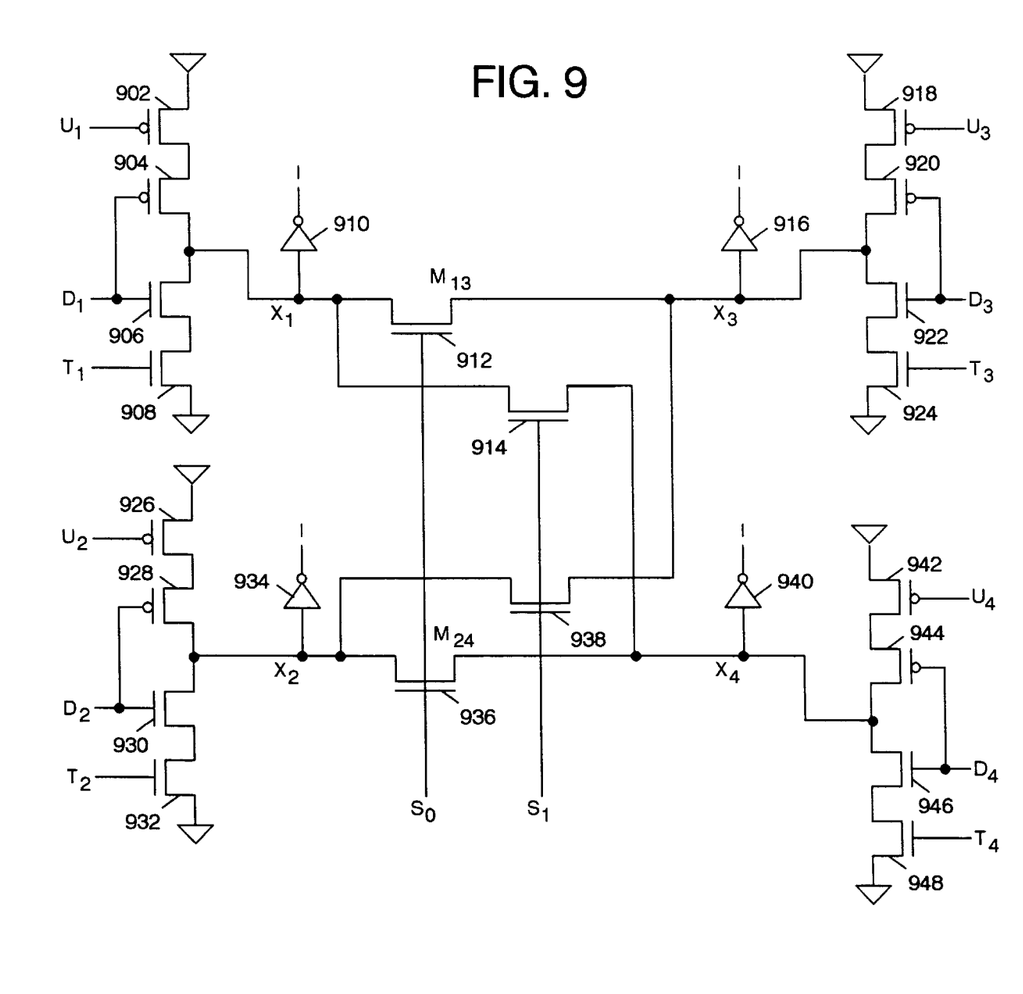
FIG. 9 illustrates, in logic diagram form, a fifth logic circuit.

Another situation where input constraints are significant is illustrated in FIG. 9, which illustrates the crossbar circuit of FIG. 3 in context. Each terminal of the crossbar is driven by a tri-state buffer and loaded with a receiving inverter. Each tri-state buffer is gated by control signals $T_i$ and $U_j$; these signals are in turn constrained by the relationship $T_i\overline{U_j}+\overline{T_i}U_j$. The pull-up and pull-down conditions for net $X_4$ are:

$$h_{X_4}\overline{U_4 D_4}+S_0\overline{U_2 D_2}+S_1\text{fheight}\overline{U_1 D_1}$$

$$l_{X_4}=T_4 D_4+S_0 T_2 D_2+S_1 T_1 D_1$$

Note that for each condition, terms involving $S_0 S_1$ drop out due to the constraint $\overline{S_0 S_1}$. This elimination can be effected by at least two methods:

1. By eliminating unsensitizable subpaths during the generation of pull-up and pull-down conditions by observing transistor directions. These transistor directions can be user annotations or derived automatically; however, in cases such as shown in FIG. 4, it may be impossible to assign directions to a particular transistor. If direction information exists, paths with consistent transistor directions are included when models of h and l are generated.

2. By eliminating unsensitizable subpaths during the generation of pull-up and pull-down conditions by verifying the sensitizability of partial paths. This adds a boolean analysis step to the path tracing to generate the pull-up and pull-down conditions. The analysis verifies that the transistors along any partial path being explored can be turned on simultaneously. This is a more general method and will cause paths requiring $S_0 S_1$ to drop out of consideration during model generation.

To sensitize a falling transition on net $X_4$ in response to a rising transition on net $D_2$, the following is required:

$$l_{x_4}(D_2=1) \cdot \overline{h_{X+di\,4}(D_{2-1})} \cdot \overline{l_{X+di\,4}(D_{2-0})}$$

$$(T_4 D_4 + S_0 T_2 + S_1 T_1 D_1) \cdot \overline{(U_4\,D_4 + S_1\overline{U_1}\,\overline{D_1})} \cdot \overline{(T_4 D_4 + S_1 T_1 D_1)}$$

$$S_0\overline{S_1} + ee\ T_2(+e, \text{ovs}\ T_4 + \overline{D_4})(U_4 + D_4)$$

If it is recognized that $T_4\overline{U_4}+\overline{T_4}U_4$ must be true (see FIG. 6), the condition simplifies:

$$S_0\overline{S_1}T_2\overline{T_4}U_4$$

To show the effects of the constraints in the sensitization conditions, we try to sensitize a falling transition on net $X_4$ in response to a rising transition on net $D_3$:

$$l_{X_4}(D_3=1) \cdot \overline{h_{X+di\,4}(D_{3-1})} \cdot \overline{l_{X+di\,4}(D_{3-0})}$$

$$(T_4 D_4 + S_0 T_2 + S_1 T_1 D_1) \cdot$$

$$\overline{(U_4\,\overline{D_4} + S_0\overline{U_2}\,\overline{D_2} + S_1\overline{U_1}\,\overline{D_1})} \cdot \overline{(T_4 D_4 + S_0 T_2 D_2 + S_1 T_1 D_1)} = 0$$

This indicates that a falling transition on net $X_4$ cannot be sensitized to a rising transition on net $D_3$.

If any inputs are unconstrained by the sensitization condition, they are essentially "don't-cares" for the transition of interest and do not directly affect the switching of the output node. Their values may be set in a number of ways: (1) they may be chosen arbitrarily; (2) the possible unspecified assignments may be exhaustively explored to find the worst-case delay over all possible assignments, or (3) they may be set by a heuristic function that seeks an assignment that produces the worst-case delay.

The values of these side inputs, however, must satisfy any existing input constraints. This need is illustrated in the example shown in FIG. 4, a subcircuit 400 of a carry-lookahead adder. Focusing on transitions occurring on output node IZ, the relevant pull-up and pull-down conditions are:

$$h_{IZ}=\overline{(C+\overline{GZ})}$$

$$l_{IZ}=C(ZB+ZA\cdot PB)$$

To sensitize a falling transition on IZ to occur in response to a rising transition on input ZB, we have the following partial sensitization condition:

$$l_{IZ}(ZB=1) \cdot \overline{h_{IZ}(ZB=1)} \cdot \overline{l_{IZ}(ZB=0)}$$

$$C \cdot GZ \cdot \overline{(ZA+PB)}$$

Since this does not require ZA to be low or place any constraints on inputs GA or PA, this sensitization condition allows patterns to be used which add unnecessarily large loads to the pull-down path. For example, nets ZA, PA, and GA could all be set high, falsely requiring that the delay calculation include the effect of discharging nodes IP and IG. From the circuit's context, it may be observed that inputs are constrained such that at most one signal in each group of G, P and Z signals can be active (or equivalently, at least two must be inactive):

$$c=(GA+ee\ \cdot \text{fheight}\overline{PA}+\text{fheight}\overline{GA}\cdot\text{fheight}\overline{ZA}+\\ \overline{PA}\cdot\text{fheight}ZA)(\text{fheight}GB\cdot\text{fheight}PB++e,\text{ovs}\ \overline{GB\cdot ZB+PB\cdot ZB})$$

Note that here and throughout this discussion, the "AND" operator ("·") has precedence over the "OR" operator ("+"). These input constraints should be satisfied before and after the transition:

$$c(ZB=0) \cdot c(ZB=1)$$

$$\overline{(GA\cdot PA+GA\cdot ZA+PA\cdot ZA)(GB\cdot PB)}$$

Combining this with the sensitization condition gives:

$$C\cdot GZ\cdot \overline{(GA\cdot PA+GA\cdot ZA+PA\cdot ZA)(GB\cdot PB)}$$

Note now that setting input ZA high to maximize the capacitance seen at output IZ forces inputs GA and PA to be low. This combination of input values accurately reflects the opening environment and provides the true worst-case sensitization of the delay from ZB to IZ. In general, any input constraints should be satisfied before and after a transition that is being sensitized.

Figure 7A:
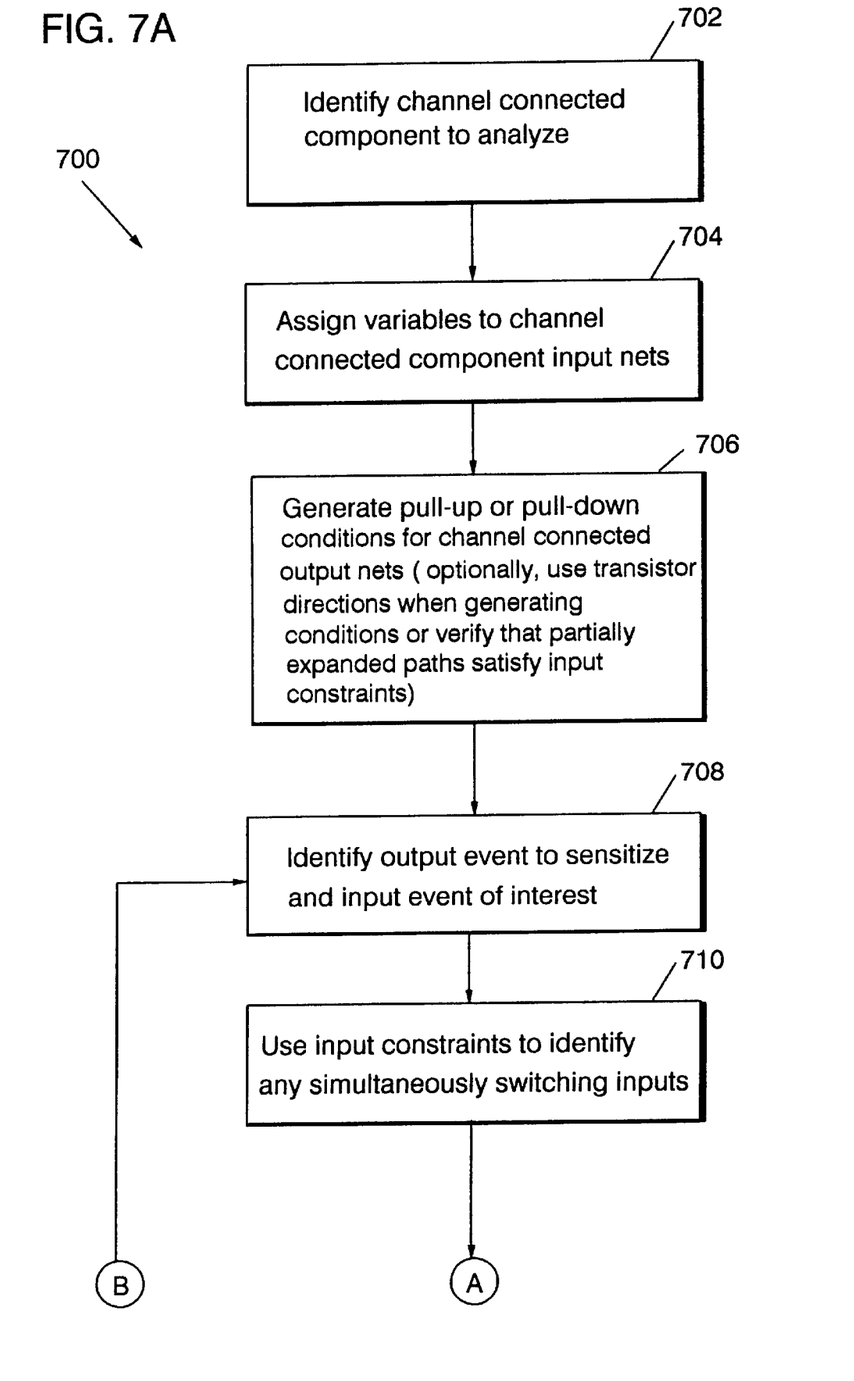
Figure 7B:
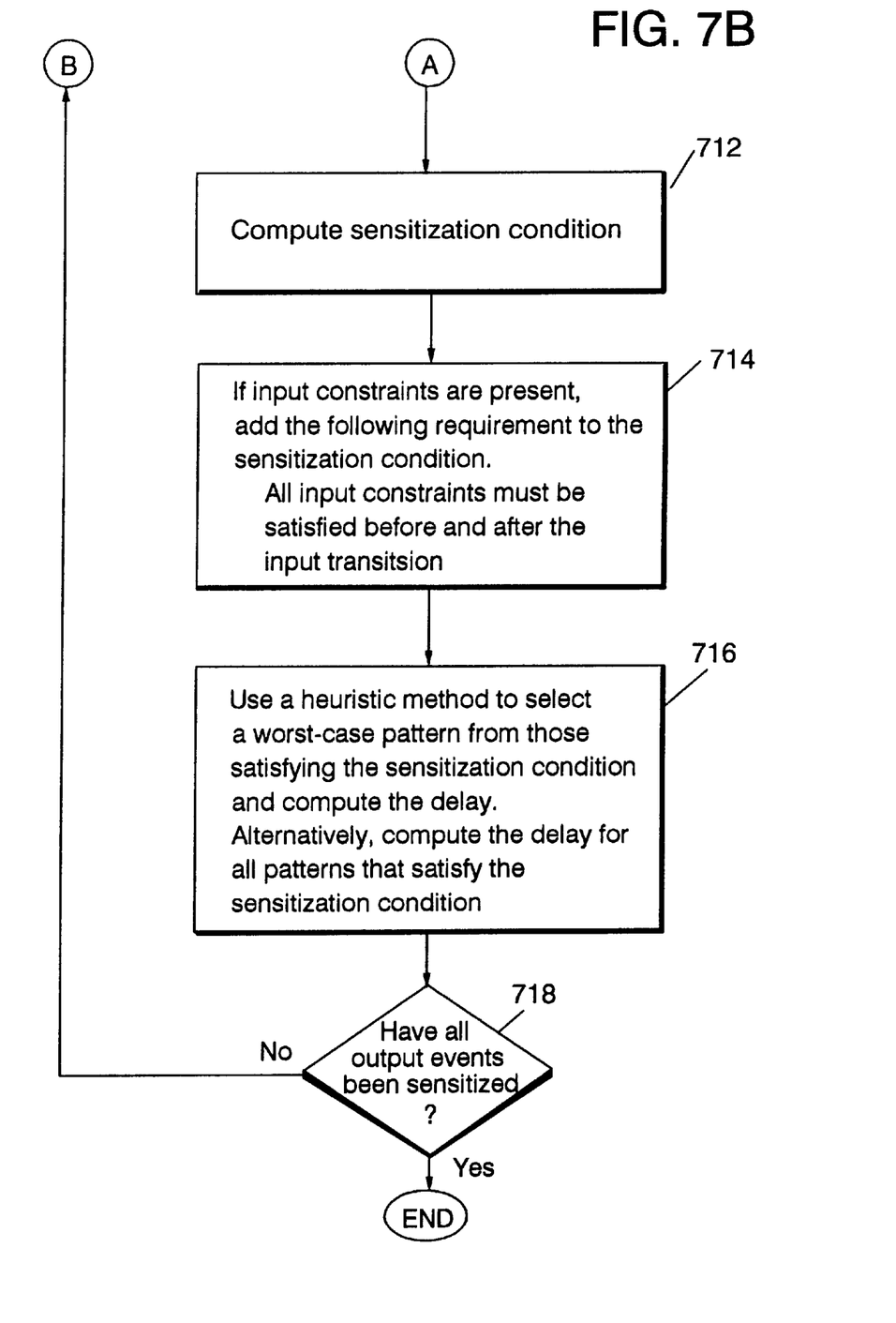

To implement the above-described methodology of the present invention, compute/propagate delay step 624 must be executed. This step and the functions performed during its execution as previously described are summarized in FIGS. 7-A through 7-B.

To compute the arrival time at a node of a circuit being simulated, it must first be determined in step 702 whether or not the node is a clock node or data node. If the node is a clock node, a clock node analysis is performed. Performance of this analysis will not be described in detail herein.

Furthermore, although details of specific delay calculation techniques are also outside the scope of this application, some comments regarding the implications of this invention on their use are relevant. One common transistor-level delay calculation technique treats all on transistors as linear resistors and all off transistors as open circuits. The delay is computed as the step response of the resulting RC network. When the RC network is a tree, a simple measure such as the Elmore delay can be used. For more complex circuits, or for higher-order approximations, the network response can be computed using Asymptotic Waveform Evaluation techniques such as those implemented in the RICE toolkit from the University of Texas. Application of this invention simply increases the number of parallel paths in the RC circuit to be analyzed. Another possible technique for transistor-level delay calculation relies on circuit simulation to directly compute the output response as a function of the input signals. Application of this invention causes all transistors connected to switching inputs to be turned on or off during the simulation while the remaining transistors are held on or off depending on the satisfying assignment obtained for the sensitization condition.

If the node is a data node, the relevant channel connected components is identified for analysis. Subsequently, in a step 704, variables are assigned to each of the channel connected component input nets. Subsequently, in a step 706, the pull-up or pull-down conditions for each channel connected output net list is generated. Optionally, a methodology by which transistor directions are used when generating conditions or verifying the partially expanded paths satisfy input constraints may also be used. Subsequently, in a step 708, an output event which should be sensitized is identified, as is an input event of interest. Next, in step 710, input constraints are used to identify any simultaneously switching inputs. A sensitization condition is subsequently computed in a step 712. If input constraints are present, an additional requirement is added to the sensitization condition. This requirement states that all input constraints must be satisfied before and after the input transition.

Next, a heuristic method issues to select a worst-case pattern from those satisfying the sensitization condition and a delay is subsequently computed in step 716. To calculate a worst-case delay using the methodology illustrated in FIGS. 7-A and 7-B, it should be noted that in step 716, if there is more than one satisfying assignment which results from the combination of the sensitization conditions for each path, a worst-case satisfying assignment will be selected by using a heuristic technique to maximize the output resistance and capacitances subject to the sensitization condition.

After a worst-case satisfying assignment, the circuit being analyzed is simulated with a generated pattern. A result is subsequently measured on the node being tested. The result indicates a delay associated with the provision of the input to the node and an output generated by the circuit under test. If the result measured in step 716 is worse that all previous transitions on the node for the specific phase, direction, and slope (mode), a memory location which corresponds to a delay associated with the present circuit being testing is updated with the new pattern. Each of steps 708–718 is repeated for all nodes included in the circuit being analyzed. If all of the nodes have been tested, a delay associated with the circuit being simulated has been determined and step 624 of the general flow illustrated in FIG. 6 has been completed. Subsequently, a next circuit is analyzed using this procedure.

The implementation of the invention described herein is provided by way of example only. However, many other implementations may exist for executing the function described herein. While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention. Furthermore, it is to be noted that although the present invention and its advantages have been described in detail, it should be understood that various changes, substitutions, and alterations can be made herein without departing from the spirit and scope of the invention as defined by the appended claims.

Although the present invention and its advantages have been described in detail, it should be understood that various changes, substitutions and alterations can be made herein without departing from the spirit and scope of the invention as defined by the appended claims.

What is claimed is:

1. A method for performing timing analysis of a logic circuit, comprising the steps of:
   identifying an input signal transition and an output signal transition of the logic circuit;
   computing a sensitization condition corresponding to the input signal transition and the output signal transition using the sensitization condition to identify a worst case condition; and
   generating a simulation pattern which enables an output of the logic circuit to transition from a first logic state to a second logic state by applying a generated signal which corresponds the sensitization condition.

2. The method of claim 1, further comprising the step of:
   simulating a function of the logic circuit by providing the simulation pattern to an input of the logic circuit.

3. The method of claim 2, further comprising the step of:
   measuring a result of the simulation pattern on the input of the logic circuit.

4. The method of claim 3 wherein the result indicates a delay associated with the provision of the input signal and the output of the logic circuit.

5. The method of claim 3, further comprising the steps of:
   determining whether the result is less than a previous result of a previous simulation pattern on the logic circuit;
   storing the previous result of the previous simulation pattern in a memory when the previous result is greater than the result; and
   storing the result of the simulation pattern in the memory when the previous result is less than the result.

6. The method of claim 3, further comprising the steps of:
   determining whether the result is less than a previous result of a previous simulation pattern on the node of the clock circuit;
   storing the previous result of the previous simulation pattern in a memory when the previous result is less than the result; and
   storing the result of the simulation pattern in the memory when the previous result is greater than the result.

7. The method of claim 1 wherein the step of computing the sensitization condition, further comprises the step of:

determining when the output of the logic circuit will not be in an undesired logic state after the input signal has transitioned from the first logic state to the second logic state.

8. The method of claim 1 wherein the step of computing the sensitization condition, further comprises the step of:

determining when the output of the logic circuit will be in a desired logic state before the input signal has transitioned from the first logic state to the second logic state.

9. The method of claim 1 wherein a step of computing the sensitization condition, further comprises the step of:

determining when the output of the logic circuit will be in a desired logic state after an input signal has transitioned from a first logic state to a second logic state.

10. The method of claim 9 wherein the step of computing the sensitization condition, further comprises the step of:

determining when output of the logic circuit will not be in an undesired logic state after the input signal has transitioned from the first logic state to the second logic state.

11. A data processing system, comprising:

a memory for storing a model of a logic circuit; and a data processor for computing a first signal being provided to the logic circuit and a second signal being output by the logic circuit in response to the first signal, the data processor computing the delay by determining a sensitization condition corresponding to the first signal and applying a generated signal which has the sensitization condition corresponding to the first signal provided to the logic circuit.

12. The data processing system of claim 11 wherein the sensitization condition determines when the output of the logic circuit will be in a desired logic state after an input signal has transitioned from a first logic level to a second logic level.

13. The data processing system of claim 11 wherein the sensitization condition determines when output of the logic circuit will be in a desired logic state before the input signal has transitioned from the first logic level to the second logic level.

14. The data processing system of claim 11 wherein the sensitization condition determines when output of the logic circuit will not be in an undesired logic state after the input signal has transitioned from the first logic level to the second logic level.

15. A program storage device readable by a machine, tangibly embodying a program of instructions executable by the machine to perform method steps for performing a timing analysis of a logic circuit, said method steps comprising:

identifying an input signal transition and an output signal transition of the logic circuit;

computing a sensitization condition corresponding to the input signal transition and the output signal transition;

using the sensitization condition to identify a worst case condition; and generating a simulation pattern which enables an output of the logic circuit to transition from a first logic state to a second logic state by applying a generated signal which corresponds to the sensitization condition.

16. The program storage device of claim 15 embodying the program of instructions executable by the machine to perform method steps, said method steps further comprising a step of:

simulating a function of the logic circuit by providing the simulation pattern to an input of the logic circuit, wherein a result indicates a delay associated with the provision of a first one of a plurality of input signals and the output generated by the logic circuit.

17. The program storage device of claim 15 embodying the program of instructions executable by the machine to perform method steps, said method steps further comprising a step of:

determining when the output of the logic circuit will be in a desired logic state after an input signal has transitioned from a first logic state to a second logic state.

18. The program storage device of claim 15 embodying the program of instructions executable by the machine to perform method steps, said method steps further comprising a step of:

determining when the output of the logic circuit will not be in an undesired logic state after the input signal has transitioned from the first logic state to the second logic state.

19. The program storage device of claim 18 embodying the program of instructions executable by the machine to perform method steps, said method steps further comprising a step of:

determining when the output of the logic circuit will be in a desired logic state before the input signal has transitioned from the first logic state to the second logic state.

* * * * *

UNITED STATES PATENT AND TRADEMARK OFFICE
CERTIFICATE OF CORRECTION

PATENT NO. : 5,946,475  
DATED : August 31, 1999  
INVENTOR(S) : Timothy Michael Burks and Robert Mains It is certified that error appears in the above-identified patent and that said Letters Patent is hereby corrected as shown below:

Column 8,  
Line 59, replace "$h_y = \overline{C} + \overline{Z}; l_Z = Y$" with -- $h_Y = \overline{C} + \overline{Z}, l_Z = Y$ --

Column 9,  
Line 53, replace "$l_Y(A_1 = 1) \cdot \overline{h_Y(A_1=1)} \cdot \overline{l_Y(A_1=0)}$"

with -- $l_Y(A_1 = 1) \cdot \overline{h_Y(A_1 = 1)} \cdot \overline{l_Y(A_1 = 0)}$ --

Column 10,  
Line 3, replace "$(\overline{0} + \overline{Z}) \cdot \overline{A_1 A_2 A_{30}} \cdot (\overline{1} + \overline{Z})$"

with -- $(\overline{0} + \overline{Z}) \cdot \overline{A_1 A_2 A_3 0} \cdot (\overline{1} + \overline{Z})$ --

Line 18, replace "$\overline{C}C_N + C\overline{C_{N=1}}$" with -- $\overline{C}C_N + C\overline{C_N} = 1$ --

Line 27, replace "$l_Y(C = 1, C_N = 0) \cdot \overline{h_Y(C = 1, C_{N=0})} \cdot \overline{l_Y(C = 0, C_{N=1})}$"

with -- $l_Y(C = 1, C_N = 0) \cdot \overline{h_Y(C = 1, C_N = 0)} \cdot \overline{l_Y(C = 0, C_N = 1)}$ --

Line 61, replace

"$(\overline{C^- C_N^-} + C^- \overline{C_N^-})(\overline{C^+ C_N^+} + C^+ \overline{C_N^+})(\overline{C^- + eeC^+}) = +e, ovs C^- C^+ C_N^- \overline{C_N^-}$"

with -- $\left(\overline{C^- C_N^-} + C^- \overline{C_N^-}\right)\left(\overline{C^+ C_N^+} + C^+ \overline{C_N^+}\right)\left(\overline{C^- C^+}\right) = \overline{C^-} C^+ C_N^- \overline{C_N^-}$ --

Column 11,  
Line 14, replace "$T_i \overline{U_i} + \overline{T_i} U_i$" with -- $T_i \overline{U_i} + \overline{T_i} U_i$ --

Line 17, replace "$h_{X_4} \overline{U_4 D_4} + S_0 \overline{U_2 D_2} + S_1 \text{fheight} \overline{U_1 D_1}$"

with -- $h_{X_4} = \overline{U_4 D_4} + S_0 \overline{U_2 D_2} + S_1 \overline{U_1 D_1}$ --

UNITED STATES PATENT AND TRADEMARK OFFICE
CERTIFICATE OF CORRECTION

PATENT NO. : 5,946,475
DATED : August 31, 1999
INVENTOR(S) : Timothy Michael Burks and Robert Mains It is certified that error appears in the above-identified patent and that said Letters Patent is hereby corrected as shown below:

Column 11 cont'd,
Line 48, replace
$$" l_{x_4}(D_2=1) \cdot \overline{h_{x+di4}(D_{2=1})} \cdot \overline{l_{x+di4}(D_{2=0})} "$$
$$\text{with } -- l_{x_4}(D_2=1) \cdot \overline{h_{X_4}(D_2=1)} \cdot \overline{l_{X_4}(D_2=0)} --$$

Line 53, replace
$$" S_0 \overline{S_1 + eeT_2(+e, ovsT_4 + D_4)}(U_4 + D_4) "$$
$$\text{with } -- S_0 \overline{S_1} T_2 \overline{(T_4 + D_4)} (U_4 + D_4) --$$

Line 63, replace
$$" l_{X_4}(D_3=1) \cdot \overline{h_{X+di4}(D_3=1)} \cdot \overline{l_{X+di4}(D_3=0)} "$$
$$\text{with } -- l_{X_4}(D_3=1) \cdot \overline{h_{X_4}(D_3=1)} \cdot \overline{l_{X_4}(D_3=0)} --$$

Column 12,
Lines 45 and 46, replace
$$" c = (GA + ee \cdot fheight\overline{PA} + fheight\overline{GA} \cdot fheight\overline{ZA} + \overline{PA} \cdot fheight\overline{ZA})$$
$$(fheight\overline{GB} \cdot fheight\overline{PB} + +e, ovsGB \cdot \overline{ZB} + \overline{PB} \cdot \overline{ZB}) "$$
$$\text{with } -- c = (\overline{GA} \cdot \overline{PA} + \overline{GA} \cdot \overline{ZA} + \overline{PA} \cdot \overline{ZA}) (\overline{GB} \cdot \overline{PB} + \overline{GB} \cdot \overline{ZB} + \overline{PB} \cdot \overline{ZB}) --$$

Signed and Sealed this

Twelfth Day of November, 2002

*Attest:*

JAMES E. ROGAN
*Attesting Officer*     Director of the United States Patent and Trademark Office